United States Patent [19]

Amacher et al.

[11] 4,266,145
[45] May 5, 1981

[54] TIME DEPENDENT MASTER RESET

[75] Inventors: Gene L. Amacher, Cambridge; Wesley D. Dickover, Thornville, both of Ohio

[73] Assignee: NCR Corporation, Dayton, Ohio

[21] Appl. No.: 37,548

[22] Filed: May 9, 1979

[51] Int. Cl.³ .................... H02H 7/20; H02H 3/093; H02H 3/247

[52] U.S. Cl. ............................ 307/200 A; 307/296 R; 361/89; 361/110; 361/187

[58] Field of Search .................. 307/200 A, 296 R; 361/89, 187, 110

[56] References Cited

U.S. PATENT DOCUMENTS

| | | | |
|---|---|---|---|
| 3,725,675 | 4/1973 | Olsen | 307/200 A |
| 4,099,068 | 7/1978 | Kobayashi et al. | 307/200 A |
| 4,122,359 | 10/1978 | Breikss | 307/200 A |
| 4,151,425 | 4/1979 | Cappa | 307/200 A |

Primary Examiner—John S. Heyman
Attorney, Agent, or Firm—J. T. Cavender; Wilbert Hawk, Jr.; Jerrold J. Litzinger

[57] ABSTRACT

A circuit for use with logic circuitry preventing any transients due to the power down and power up conditions of a power supply from causing any false or random operations of the logic. The turn off transients are suppressed by a reset signal to the logic circuitry generated by a timing module which is triggered when it detects an absence of AC signal over a specified period of time and is then held in a reset mode until the power supply voltage completely decays. The turn on transients are suppressed by a reset signal to the logic circuitry generated by the timing module, which is held in a reset mode until the power supply voltage has stabilized.

13 Claims, 1 Drawing Figure

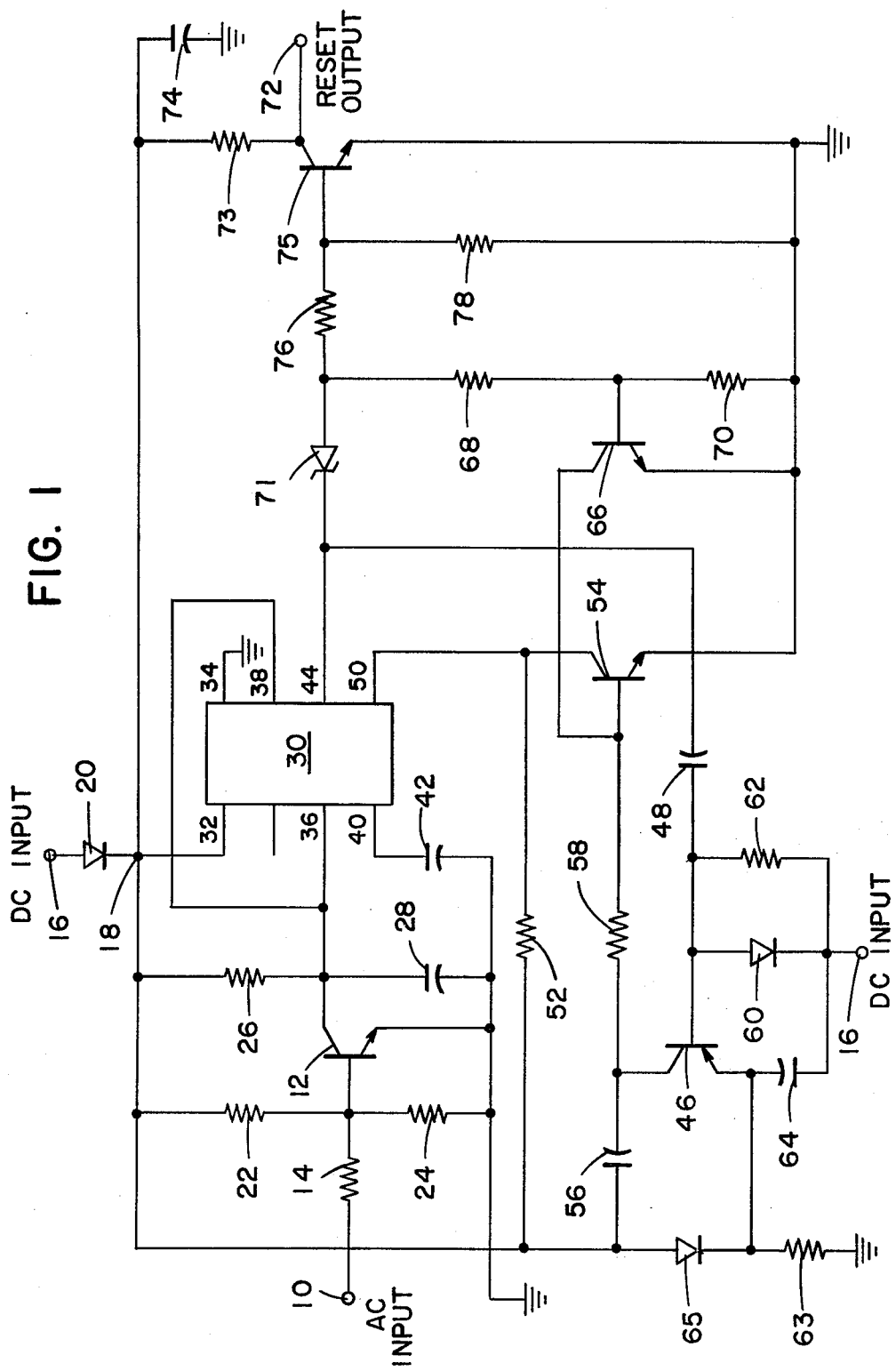
FIG. I

TIME DEPENDENT MASTER RESET

BACKGROUND OF THE INVENTION

The present invention relates to a control circuit for preventing any undesirable logic functions from occurring during either the decaying or generating of a power supply.

The problem of eliminating power supply transients due to turn-on and turn-off is addressed in U.S. Pat. No. 4,054,831. The method used therein eliminates the turn-on transients by rendering the control amplifier non-responsive for a predetermined period after the power supply is turned on, whereas the turn-off transients are eliminated by very quickly restoring the non-responsive means of the control amplifier after the turn-off instant of the power supply.

SUMMARY OF THE INVENTION

In the present invention, the transients created by the decay and generation of a power supply are not eliminated, but rather are prevented from interfering with any logic circuits by providing a predetermined reset pulse during power-down and power-up conditions. This reset pulse is controlled by a precision timer, such as a type Ser. No. 72555, manufactured by Texas Instruments. The timer provides a reset signal for controlling a logic circuit during these periods. Due to the instability of the circuitry during times of power fluctuation, it is important that logic circuits be reset to a known condition to prevent any unwanted operation.

The reset signal of the present invention is generated when the circuit detects that the 60 cycle AC signal from the power supply is absent. When the absence is detected over a specified period of time, the timing module activates and provides a signal used to reset the logic circuitry. The module is so held in the reset mode until the power supply has fully decayed. The timing module is also held in the reset mode when the power supply is switched on, thus again providing a reset signal for the logic circuitry until the power supply has stabilized.

From the foregoing, it can be seen that it is a primary object of the present invention to provide protection for logic circuitry from transients caused by the generation and decay of a power supply.

It is another object of the present invention to provide a reset signal to logic circuitry in order to keep the logic in a known condition during initialization of the power supply.

These and other objects of the present invention will become more apparent and better understood when taken in conjunction with the following drawing and description.

BRIEF DESCRIPTION OF THE DRAWING

FIG. 1 is a schematic illustration of the invention.

DESCRIPTION OF THE PREFERRED EMBODIMENT

Referring to FIG. 1, the AC input terminal 10 from the power supply is connected to the base of a transistor 12 via a resistor 14. Transistor 12 detects the absence of the 60 cycle AC signal supplying the circuit. The DC input terminal 16 from the power supply is coupled to a junction 18 via a diode 20, providing a source of DC reference voltage at such junction. Resistors 22 and 24 form a voltage divider for the DC reference voltage, with resistor 22 connected between junction 18 and the base of transistor 12, and resistor 24 connected between such base and ground. A resistor 26 and a capacitor 28 form a timing circuit, with resistor 26 connected between the DC reference voltage at junction 18 and the collector of transistor 12, and with capacitor 28 connected between such collector and ground. The emitter of transistor 12 is coupled directly to ground. In basic operation, this section of the circuit detects that the power supply has begun to decay.

A timing module 30 is shown as a conventional device (defined previously). This module is activated when the circuit has detected a loss of the power supply. Vcc pin 32 of such module is connected to the DC reference voltage at junction 18, and the GND pin 34 is connected to ground. The threshold pin 36 and trigger pin 38 of such module are connected together at the collector of transistor 12. The control voltage pin 40 is coupled to ground via capacitor 42 to improve the stability of the module in this circuit. The output pin 44 of such module 30 is coupled to the base of a transistor 46 by a capacitor 48.

The reset pin 50 of timing module 30 is connected to the DC reference voltage at junction 18 via a resistor 52, which holds such reset terminal 50 at a positive voltage level during normal circuit operation. Reset pin 50 is also connected to the collector of a transistor 54. Transistor 54 is used in controlling the circuit in both the discharge and charge conditions of the power supply.

When the power supply is decaying, the circuit is controlled by transistors 46 and 54. The collector of transistor 46 is coupled to the DC reference voltage at junction 18 by a capacitor 56, and is connected to the base of transistor 54 via a resistor 58. The base of transistor 46 is coupled to the DC input 16 via a parallel combination of a diode 60 and a resistor 62. The emitter of transistor 46 is coupled to ground via a resistor 63, and is connected to the DC input 16 through a capacitor 64. Such emitter is also connected to the DC reference voltage at junction 18 via a diode 65.

Transistors 54 and 66 operate the power up section of the circuit. Resistors 68 and 70 form a voltage divider to control the operation of transistor 66. Resistor 68 is connected between the cathode of a zener diode 71 and the base of transistor 66, and resistor 70 is connected between such base and ground. The collector of transistor 66 is connected to the base of transistor 54. The emitters of transistors 54 and 66 are both coupled directly to ground.

Zener diode 71 connects the output pin 44 of the timing module 30 with the output section of the circuit. The emitter of transistor 75, which constitutes the reset output 72, is coupled to the DC reference voltage at junction 18 via a resistor 73. The emitter of transistor 75 is connected directly to ground. A capacitor 74 couples the DC reference voltage at junction 18 to ground. A resistor 76, which connects zener diode 71 and the base of transistor 75, forms a voltage divider with a resistor 78, which couples such base to ground.

In operation, the transistor 12 conducts during that part of every cycle at which a low AC voltage signal from the power supply is applied to AC input 10. During the part of the cycle that such transistor 12 is not conducting, capacitor 28 will charge through the resistor 26 by way of the DC input 16 through diode 20.

When transistor 12 begins to conduct again, capacitor 28 is discharged.

If the AC input 10 is removed, capacitor 28 will charge through resistor 26 and when the voltage across the capacitor 28 reaches two-thirds of the voltage at pin 5 or terminal 32 of the timing module 30, the input at terminals 36 and 38 of the module 30 will change the output terminal 44 of such module from a positive voltage level to ground, thus causing transistors 75 and 66 to stop conducting. This in turn causes the reset output 72 to go to a positive voltage, thus protecting the logic circuitry by holding it in a stabilized condition. As the DC voltage from the power supply decays, capacitor 74 will maintain the voltage due to the blocking action of the diode 20.

When the output pin or terminal 44 of the timing module 30 is grounded, capacitor 48 begins to charge, causing transistor 46 to conduct. This causes capacitor 56 to discharge, which in turn causes transistor 54 to conduct. When transistor 54 is in the conduction state, the reset terminal 50 of the timing module 30 is pulled to ground, which insures that the output terminal 44 of such module 30 will continue to stay grounded until the power supply has decayed completely.

When the power supply is initialized, capacitor 56 charges through the resistor 58 and the base of transistor 54, causing the transistor 54 to conduct. This pulls the reset terminal 50 of the timing module 30 to ground and keeps the output terminal 44 thereof grounded. The charging time for capacitor 56 will keep transistor 54 conducting until the power supply voltage has stabilized. Also, when the power supply is initialized, a positive pulse of a few volts can occur at the output terminal 44 of the timing module 30 due to the instability of the module at low voltage; the zener diode 70 being provided to prevent the transistors 75 and 66 from conducting due to this pulse.

When the charging current for capacitor 56 diminishes, transistor 54 stops conducting and this allows the timing module 30 to function normally. The AC input at 10 causes transistor 12 to conduct, causing the terminals 36 and 38 of the timing module 30 to be thereby grounded. The output terminal 44 of module 30 then goes to a positive voltage. When the voltage rises above the zener diode 71 voltage, each of the transistors 66 and 75 conducts. When transistor 75 conducts, the reset output 72 is grounded, removing the reset signal from the logic circuitry. When transistor 66 conducts, the base of the transistor 54 is grounded. This prevents any potential oscillation of transistor 54 that could affect the reset terminal 50 of the timing module 30 and thus insures stable operation of the timing module 30.

Typical values of the components of the circuit can be as follows: T,0070 T,0071 T,0072 T,0073

While the invention has been described in detail and with reference to a specific embodiment thereof, it will be understood by those skilled in the art that various changes and modifications can be made therein without departing from the spirit and scope of the invention. Therefore, it is to be understood that the present invention is not to be limited beyond that as required by the appended claims.

What is claimed is:

1. A circuit for protecting logic circuitry from transients caused by the decay of a power supply, comprising:
   first circuit means for generating a first signal upon detecting the absence of an AC signal from said power supply;
   second circuit means, responsive to said first signal, for generating a second signal upon said first signal reaching a predetermined voltage condition;
   third circuit means, coupled to said second circuit means, for generating a third signal upon generation of said second signal for use in protecting said logic circuitry; and
   fourth circuit means, coupled to said second and third circuit means, for maintaining said second and third signals until said power supply voltage decays to a predetermined level.

2. The circuit of claim 1, wherein said predetermined voltage level of said first signal is controlled by a resistor-capacitor network.

3. The circuit of claim 2, wherein said second circuit means comprises a precision timer.

4. The circuit of claim 3, wherein said first circuit means includes sensing means for detecting the absence of an AC signal from said power supply.

5. The circuit of claim 3, wherein said third circuit means includes first switching means for applying said third signal to said logic circuitry.

6. The circuit of claim 5, wherein said fourth circuit means includes second switching means for maintaining said second and third signals.

7. The circuit of claim 6, wherein said sensing means and said first and second switching means comprise transistors.

8. A circuit for protecting logic circuitry from transients caused by the generation of a power supply, comprising:
   first circuit means for generating a first signal for a predetermined time upon the generation of said power supply;
   second circuit means, coupled to said first circuit means, for generating a second signal in response to said first signal;
   third circuit means, coupled to said second circuit means and responsive to said second signal, for generating a third signal for use in protecting said logic circuitry until said first signal subsides; and
   fourth circuit means, coupled to said first and third circuit means, for stabilizing said first circuit means after said first signal has subsided.

9. The circuit of claim 8, wherein said predetermined time is controlled by a capacitor.

10. The circuit of claim 9, wherein said second circuit means comprises a precision timer.

11. The circuit of claim 10, wherein said third circuit means includes first switching means for applying said third signal to said logic circuitry.

12. The circuit of claim 11, wherein said fourth circuit means includes second switching means for stabilizing said first circuit means.

13. The circuit of claim 12, wherein said first and second switching means comprise transistors.

* * * * *

UNITED STATES PATENT AND TRADEMARK OFFICE
CERTIFICATE OF CORRECTION

PATENT NO. : 4,266,145
DATED : May 5, 1981
INVENTOR(S) : Gene L. Amacher and Wesley D. Dickover It is certified that error appears in the above-identified patent and that said Letters Patent are hereby corrected as shown below:

Column 3, line 54, cancel "T,0070 T,0071 T,0072 T,0083" and insert the following:

| Resistors | Value | Transistors | Type |
|---|---|---|---|
| 14,52,62,70,78 | 10K ohms | 12,54,66,75 | 2N3904 |
| 63,73 | 4.7K ohms | 46 | 2N3906 |
| 24 | 1K ohms | | |
| 76 | 2K ohms | | |
| 68 | 20K ohms | Diodes | Type |
| 58 | 33K ohms | 71 | IN5522 |
| 22 | 100K ohms | 20,60,65 | IN914 |
| 26 | 510K ohms | | |

| Capacitors | Value |
|---|---|
| 48,64 | 4.7 microfarads |
| 42 | .01 microfarads |
| 28 | .1 microfarads |
| 56 | 10 micorfarads |
| 74 | 200 microfarads |

Signed and Sealed this

Fourth Day of August 1981

[SEAL]

Attest:

GERALD J. MOSSINGHOFF

Attesting Officer    Commissioner of Patents and Trademarks